United States Patent [19]

Nakamura et al.

[11] Patent Number: 4,967,101
[45] Date of Patent: Oct. 30, 1990

[54] PRE-DRIVE CIRCUIT

[75] Inventors: Shigeo Nakamura; Osamu Yairo, both of Oshino, Japan

[73] Assignee: Fanuc Ltd., Minamitsuru, Japan

[21] Appl. No.: 224,882

[22] PCT Filed: Jan. 29, 1988

[86] PCT No.: PCT/JP88/00081
§ 371 Date: Jul. 11, 1988
§ 102(e) Date: Jul. 11, 1988

[87] PCT Pub. No.: WO88/05978
PCT Pub. Date: Aug. 11, 1988

[30] Foreign Application Priority Data

Jan. 29, 1987 [JP] Japan ............... 62-019386

[51] Int. Cl.$^5$ ............ H03K 3/01; H03K 17/687; H03K 17/60; G05F 1/40
[52] U.S. Cl. ............ 307/270; 307/571; 307/583; 307/253; 323/289
[58] Field of Search ........... 307/270, 253, 571, 573, 307/575, 577, 583, 584, 280, 282, 246, 300, 570; 323/284, 289

[56] References Cited

U.S. PATENT DOCUMENTS

| 3,566,158 | 2/1971 | Paine | 307/253 |
| 3,896,367 | 7/1975 | Frantz | 307/570 |
| 4,052,623 | 10/1977 | Loberg | 307/571 |
| 4,423,341 | 12/1983 | Shelly | 307/570 |
| 4,461,966 | 7/1984 | Hebenstreit | 307/571 |
| 4,511,815 | 4/1985 | Wood | 307/584 |
| 4,554,462 | 11/1985 | Komiya et al. | 307/575 |

FOREIGN PATENT DOCUMENTS

| 0069211 | 4/1986 | Japan | 307/571 |
| 0224725 | 10/1986 | Japan | 307/571 |
| 2109184 | 5/1983 | United Kingdom | |

OTHER PUBLICATIONS

Supplemental European Search Report for EP-88-9-0-1312, The Hague, Apr. 2, 1990.
Fitzgerald et al., "Basic Electrical Engineering, Circuits Electronics Machines Controls", Fifth Edition, 1981, pp. 413–417.
D. E. Norton, "Turnoff Circuit", IBM Technical Disclosure Bulletin, vol. 7, No. 6, Nov. 1964, p. 428.
C. J. Palmucci, "Switching Regulator with Transistor Turnoff", IBM Technical Disclosure Bulletin, vol. 16, No. 4, Sep. 1973, p. 1161.

Primary Examiner—Stanley Miller
Assistant Examiner—Trong Phan
Attorney, Agent, or Firm—Staas & Halsey

[57] ABSTRACT

A pre-drive circuit for controlling turn-on/turn-off of a MOS-type field-effect transistor via a pulse transformer has an element provided between the secondary side of the pulse transformer and the MOS-type field-effect transistor for electrically isolating the pulse transfomer from the MOS-type field-effect transistor when the gate-drain voltage of the MOS-type field-effect transistor becomes negative to a certain degree. Thus, the arrangement is such that the gate-drain voltage of the MOS-type field-effect transistor will not become excessively negative.

17 Claims, 2 Drawing Sheets

2 PRE-DRIVE CIRCUIT
1 SWITCHING CIRCUIT (Prior Art) Fig. 3

PRE-DRIVE CIRCUIT

BACKGROUND OF THE INVENTION

1. Field of the Invention

This invention relates to a pre-drive circuit used in a switching regulator, a DC-DC converter or the like.

2. Description of the Related Art

A pre-drive circuit, one example of which is shown in FIG. 3, is widely known and is adapted to turn the current that flows into the primary side of a pulse transformer on and off, apply the pulses generated on the secondary side of the transformer to a MOS-type field-effect transistor (hereinafter referred to as a "FET") for power, and exercise control to turn a load current on and off by the power FET.

In accordance with the conventional circuit shown in FIG. 3, the secondary side of a pulse transformer T is connected directly to the gate and source of a power FET Q1, and the power FET Q1 is subjected to turn-on/turn-off control by using a drive transistor Q2 connected to the primary side of the pulse transformer Q2. The power FET used in this pre-drive circuit naturally has a large electrostatic capacity (input capacity) as seen from the gate since the current controlled is large.

In FIG. 3, a switching circuit 1 controls a current supplied from a power supply PS to a load L by means of the power FET Q1. This circuit is connected to the pre-drive circuit 2. When the switching transistor Q2 is turned on, the gate of the power FET Q1 is charged to the positive side by the voltage whose polarity is indicated by the solid line, so that the power FET Q1 is turned on. When the switching transistor Q2 is turned off in order to turn off the power FET Q1, the charge stored in the gate of the power FET Q1 becomes a current $I_E$, which is indicated by the broken line, and is discharged into the secondary coil of the pulse transformer T. With further charging on the negative side, the power FET Q1 is turned off. ZD1 and ZD2 denote protective Zener diodes which limit the voltage applied to the gate of the power FET Q1 so that this voltage will not become excessive.

When the power FET Q1 is turned off after being turned on in the conventional pre-drive circuit of the type described above, it is necessary to preset the magnetic flux of the pulse transformer T to an initial value and charge the gate to a negative voltage required to turn off the power FET Q1. Therefore, the larger the input capacity of the power FET Q1, the shorter the elapsed time from turn-on to turn-off of the power FET Q1 and the greater the change in gate voltage with respect to time, the larger the current $I_E$ must be which flows through the path comprising the source and gate of the power FET Q1. Accordingly, the core of the pulse transformer T is required to be correspondingly large.

In the end, the energy charged in the gate of the power FET Q1 is lost. Consequently, it is meaningless to charge the gate into an unnecessary voltage region beyond the negative voltage that turns off the power FET Q1. Moreover merely increasing the driving power lowers the efficiency of the driving power.

As set forth above, it is necessary that the magnetic flux of the power transformer be rapidly reset to an initial value for the next drive cycle. However, since the gate of the power FET Q1 is charged and connected directly to the secondary side of the pulse transformer T, as mentioned above, time is required for the electric charge resulting from the charging operation to discharge. Hence the flux of the pulse transformer T cannot be rapidly reset to the initial value. Consequently, when high-speed switching is made to take place, there is a time delay for the discharge of the above-mentioned electric charge and, hence, normal operation cannot be achieved.

SUMMARY OF THE INVENTION

The present invention has been devised in view of the foregoing points and its object is to provide a pre-drive circuit for controlling the turn-on/turn-off of a power FET via a pulse transformer, wherein the influence of an electric charge which accumulates in the gate input capacity of the power FET is mitigated, thereby enabling operation at a low driving power and preventing a decline in performance at high-speed switching.

In order to improve upon the drawbacks of the conventional art described above, the present invention provides a pre-drive circuit for transmitting a signal, which is applied to a first switching element that renders intermittent a current flowing through a primary side of a pulse transformer, to a first MOS-type field-effect transistor controlled by pulses generated on a secondary side of the pulse transformer to render a load current intermittent, comprising a pulse transformer in which the current which flows through the primary side is controlled and rendered intermittent by the switching element, detecting means for detecting a predetermined negative voltage when a gate voltage of the MOS-type field-effect transistor makes a transition to a negative region from a positive direction, and interrupting means for interrupting an output on the secondary side of the pulse transformer, which output is inputted to the gate of the MOS-type field-effect transistor, when the detecting means detects the predetermined negative voltage.

According to the invention, when the MOS-type field-effect transistor is switched from the turned-on state to the turned-off state, the voltage across the gate and source of the MOS-type field-effect transistor exceeds a set value and makes a transition to the negative side. When this occurs, the MOS-type field-effect transistor and the secondary side of the pulse transformer are cut off from each other by the interrupting means, thereby preventing the gate from being charged to a region of an unnecessary negative voltage.

BRIEF DESCRIPTION OF THE DRAWINGS

FIG. 3 is a circuit diagram of a pre-drive circuit according to the prior art.

DESCRIPTION OF THE PREFERRED EMBODIMENTS

An embodiment of the present invention will now be described with reference to the drawings.

Figure 1:
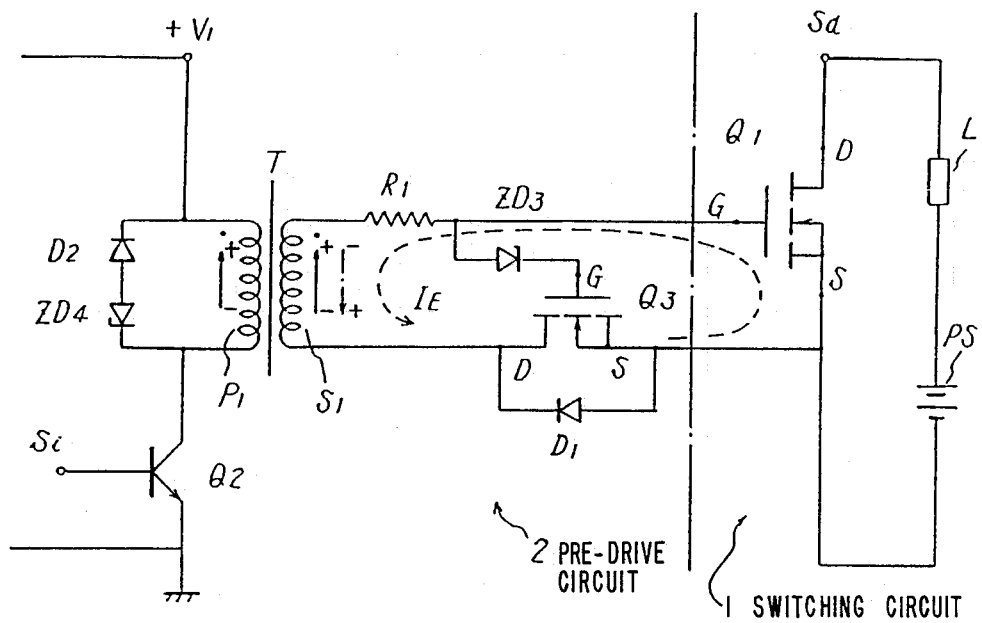
FIG. 1 is a circuit diagram illustrating a pre-drive circuit embodying the present invention, as well as peripheral circuitry.
Figure 1:
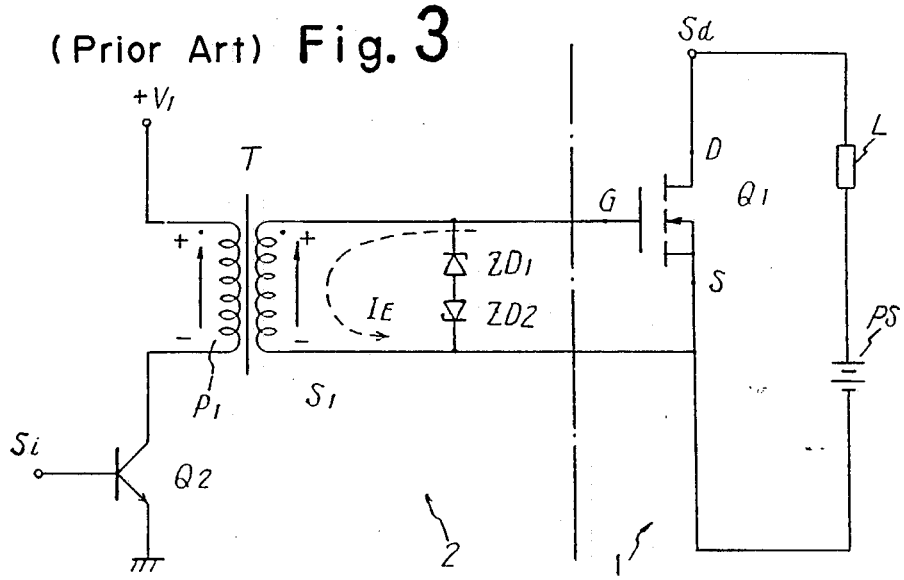

FIG. 1 is a pre-drive circuit illustrating a first embodiment of the present invention.

The switching circuit 1 to be driven by the predrive circuit 2 is illustrated in simplified form and has a power FET Q1 turned on or turned off by a control signal from the pre-drive circuit The source terminal of the power FET Q1 is connected to the source terminal of a power FET Q3 constituting a first control circuit. The drain terminal of the FET Q3 is connected to one end of the secondary coil S1 of the pulse transformer T. The other end of the secondary coil is connected to the gate terminal of the power FET Q1 via a current limiting resistor R1, and to the gate terminal of the FET Q3 via a Zener diode ZD3. A diode D1 is connected across the source and drain of the FET Q3 in such a manner that the conduction direction is from the source to the drain. A series circuit comprising a diode D2 and a Zener diode D4 is connected in parallel with the primary side of the pulse transformer T. A power supply V1 is connected to the collector of a drive transistor Q2 via a primary coil P1 of the pulse transformer T. The emitter of transistor Q2 is connected to ground. The circuit arrangement is such that a control signal Si enters the base of the drive transistor Q2.

When the drive transistor Q2 is turned on in order to turn on the power FET Q1, a voltage having a polarity in the direction of the arrow indicated by the solid line in FIG. 1 is produced in the secondary coil S1 of the pulse transformer T. As a result of this voltage, the gate of the power FET Q1 is charged via the current-limiting resistor R1 and the diode D1 provided across the drain and source of the FET Q3 in the first control circuit; hence, the power FET Q1 is turned on. When the transistor Q2 is turned off in order to change the power FET Q1 from the turned-on state to the turned-off state, the electric charge which has accumulated in the gate of the power FET Q1 flows through a path composed of the current limiting resistor R1, the secondary coil S1 of pulse transformer T, the FET Q3 and the power FET Q1. Thus, the charge which has accumulated in the gate of the power FET Q1 is drawn off, thereby lowering the gate voltage. When the gate voltage attains a value near 0 V, the power FET Q1 is turned off. When the gate voltage drops further to the negative side and eventually surpasses a set voltage decided by the Zener voltage of the Zener diode ZD3, the electric charge at the gate of the control FET Q3 is drawn off via the Zener diode ZD3, so that the voltage across the gate and source of the FET Q3 becomes approximately 0 V and the FET Q3 is placed in the cut-off state, thereby interrupting the path of the current $I_e$ Accordingly, the gate voltage of the power FET Q1 will become more negative. The output voltage of the pulse transformer T which grows more negative is impressed upon the circuit composed of the diode D2 and Zener diode ZD4 and connected in parallel with the primary side of the pulse transformer T, whereby the magnetic energy left in the core of the pulse transformer T is dissipated. When the magnetic energy is released, the flux of the pulse transformer T is reset to the initial value and the terminal voltage rapidly becomes 0 V. The current-limiting resistor R1 limits switching which is faster than necessary by limiting the current which flows into or out of the gate of the power FET Q1, and thus functions to suppress the generation of noise or surge voltage.

In the foregoing embodiment as described above, when the drive transistor Q2 is turned from on to off in order to turn the power FET Q1, which is used as a switching element, from on to off, the first control circuit is operated in such a manner that the gate of the power FET Q1 will not be charged into an unnecessary voltage region. Owing to the circuit composed of the diode D2 and Zener diode ZD4 provided on the primary side of the pulse transformer T, the flux of the pulse transformer T is rapidly reset to the initial value for the next drive cycle.

A second embodiment of the invention will now be described with reference to FIG. 2. This embodiment differs from the first in that the pulse transformer T has a second primary coil P2, and in that there is provided a control circuit for controlling the second primary coil. The rest of the circuitry is the same as that of the first embodiment. These portions are indicated by the same reference characters in FIGS. 1 and 2 and a description thereof is omitted.

Figure 2:
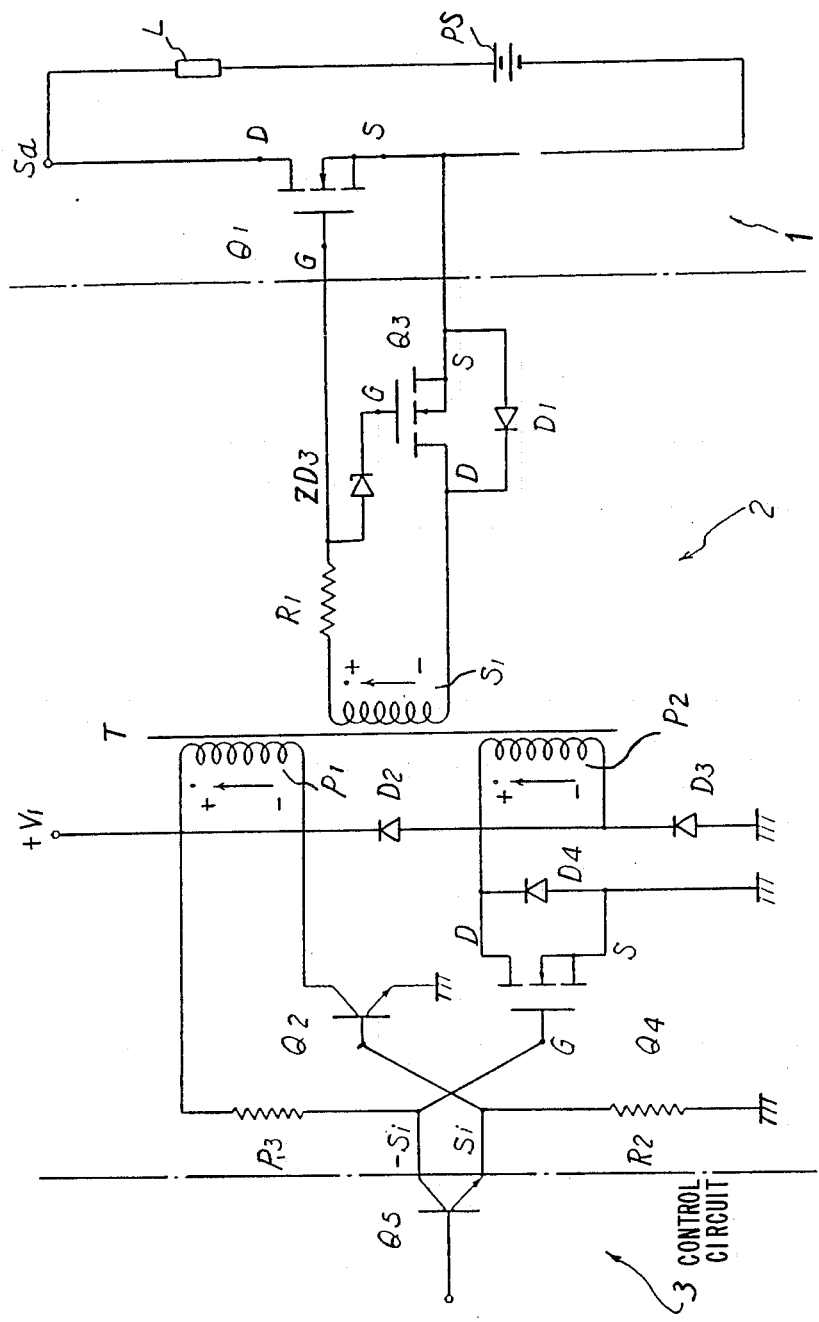
FIG. 2 is a circuit diagram illustrating a second embodiment of the present invention.

In FIG. 2, the pulse transformer T is provided with the second primary coil P2. One end of the coil P2 is connected to the drain terminal of a control FET Q4, the source of which is grounded. This end of coil P2 is also connected to ground via diode D4. Applied to the gate of the FET Q4 is an input signal -Si, described below. The other end of the second primary coil P2 is connected to ground, via a diode D3. This other end of the second primary coil P2 of pulse transformer T is also connected to the power supply V1 via the diode D2. Connected to the base of the drive transistor Q2 and the gate of the controller FET Q4 is a signal output transistor Q5 of a control circuit 3 which supplies the aforementioned base and gate with signals Si, -Si of opposite phase. A base resistor R2 is connected to the base of the drive transistor Q2, and a resistor R3 is connected to the gate of the FET Q4.

When the power FET Q1 serving as the switching element is turned off by the drive transistor Q2 after having been turned on in the circuit of the second embodiment described above, the control FET Q4 is turned on at the same time that the drive transistor Q2 is turned off. When the control FET Q4 attains the turned-on state, the second primary coil P2 of the pulse transformer T passes a current through the path composed of the diode D3 and control FET Q4, whereby the terminal voltage of the pulse transformer is rapidly brought to 0 V. As a result of this operation, the electric charge which has accumulated on the gate of the power FET Q1 is drawn off, so that the gate voltage quickly becomes 0 V and the power FET Q1 is turned off. Thereafter, operation up to the point at which the FET Q3 is cut off is the same as in the first embodiment. After the FET Q3 has attained the cut-off state, the output voltage of the pulse transformer T becomes more negative and is clamped to the power supply V1 via the diode D2. Note diode D4 acts to clamp the end of coil P2 which is connected to the drain of FET Q4 to ground. When the magnetic energy is subsequently dissipated, the magnetic flux of the pulse transformer T is reset to the initial value to prepare for the next drive cycle, as in the case of the first embodiment.

Though the invention has been described with regard to two embodiments, different embodiments can readily be made without departing from the spirit of the invention. Therefore, it is to be understood that the invention is not limited to the specific embodiments thereof but rather by the scope of the claims.

INDUSTRIAL APPLICABILITY

In accordance with the present invention, there is provided a pre-drive circuit for subjecting a power FET to turn-on/turn-off control via a pulse transformer, wherein the influence of the input capacity of the power FET is diminished to decrease drive power and reduce the size of the pulse transformer, and wherein a decline in performance that would otherwise be caused by the input capacity at the time of high-speed switching can be reduced.

We claim:

1. A pre-drive circuit for transmitting a signal to a gate of a first MOS-type field-effect transistor controlled to render a load current intermittent, comprising:
    a pulse transformer having a primary side for receiving an intermittent primary current and a secondary side, operatively connected to the gate of the first MOS-type field effect transistor, to supply an intermittent secondary current thereto;
    detecting means for detecting a predetermined negative voltage when a gate voltage of the first MOS-type field-effect transistor makes a transition to a negative region from a positive direction; and
    interrupting means for interrupting the intermittent secondary current from the secondary side of said pulse transformer, when said detecting means detects the predetermined negative voltage to prevent the gate voltage from being charged more negative than the predetermined negative voltage.

2. A pre-drive circuit according to claim 1, wherein said interrupting means comprises a second MOS-type field-effect transistor operatively connected in series between the secondary side of said pulse transformer and the gate of the first MOS-type field-effect transistor.

3. A pre-drive circuit according to claim 2, further comprising a diode, connected across the drain and source of said second MOS-type field-effect transistor, for providing a current path when the first MOS-type field-effect transistor is driven from the turned-off state to the turned-on state.

4. A pre-drive circuit according to claim 3, wherein said detecting means is a Zener diode operatively connected between the gate of said second MOS-type field-effect transistor and the secondary side of said pulse transformer.

5. A pre-drive circuit according to claim 3, further comprising a resistor, is operatively connected to the second side of said pulse transformer and the first MOS-type field-effect transistor, for limiting current.

6. A pre-drive circuit according to claim 3, wherein the primary side of said pulse transformer is provided with first and secondary primary coils, and
    wherein said pre-drive circuit further comprises a second switching element, operatively connected in parallel with the second primary coil, in for short-circuiting the second primary coil when the first MOS-type field-effect transistor is operated to change from a turned-on to a turned-off state.

7. A pre-drive circuit according to claim 2, wherein said detecting means is a Zener diode operatively connected between the gate of said second MOS-type field-effect transistor and the secondary side of said pulse transformer.

8. A pre-drive circuit according to claim 7, further comprising a resistor, operatively connected to the secondary side of said pulse transformer and the first MOS-type field-effect transistor, for limiting current.

9. A pre-drive circuit according to claim 7, wherein the primary side of said pulse transformer is provided with first and secondary primary coils, and
    wherein said pre-drive circuit further comprises a second switching element, operatively connected in parallel with the second primary coil, in for short-circuiting the second primary coil when the first MOS-type field-effect transistor is operated to change from a turned-on to a turned-off state.

10. A pre-drive circuit according to claim 2, further comprising a resistor, operatively connected to the secondary side of said pulse transformer and the first MOS-type field-effect transistor, for limiting current.

11. A pre-drive circuit according to claim 10, wherein the primary side of said pulse transformer is provided with first and secondary primary coils, and
    wherein said pre-drive circuit further comprises a second switching element, operatively connected in parallel with the second primary coil, in for short-circuiting the second primary coil when the first MOS-type field-effect transistor is operated to change from a turned-on to a turned-off state.

12. A pre-drive circuit according to claim 10, further comprising a series circuit having a diode and a Zener diode operatively connected in parallel with the primary side of said pulse transformer.

13. A pre-drive circuit according to claim 2, wherein the primary side of said pulse transformer is provided with first and secondary primary coils, and
    wherein said pre-drive circuit further comprises a second switching element, operatively connected in parallel with the second primary coil, in. for short-circuiting the second primary coil when the first MOS-type field-effect transistor is operated to change from a turned-on to a turned-off state.

14. A pre-drive circuit according to claim 2, wherein the primary side of said pulse transformer is provided with first and second primary coils, and
    wherein said pre-drive circuit further comprises a second switching element, operatively connected in parallel with the second primary coil, in for short-circuiting the second primary coil when the first MOS-type field-effect transistor is operated to change from a turned-on to a turned-off state.

15. A pre-drive circuit according to claim 14, further comprising a series circuit having a diode and a Zener diode operatively connected in parallel with the primary side of said pulse transformer.

16. A pre-drive circuit according to claim 1,
    wherein the primary side of said pulse transformer is provided with first and secondary primary coils, and
    wherein said pre-drive circuit further comprises a control circuit, including:
        inverting means, operatively connected to the first MOS-type field-effect transistor, for producing an inverted signal from the signal to be transmitted by said pre-drive circuit; and
        short-circuit means for short-circuiting the second primary coil when the first MOS-type field-effect transistor is to be turned off, said short-circuiting means being controlled by the inverted signal produced by said inverting means.

17. A pre-drive circuit for transmitting a signal to a gate terminal of a drive field effect transistor to render a load current intermittent, comprising:
    a pulse transformer having a primary side for receiving an intermittent primary current and a secondary side, the secondary side having first and second terminals, the first terminal operatively connected to the gate of the drive field effect transistor for supplying an intermittent secondary current thereto;

a control field effect transistor having a drain terminal operatively connected to the second terminal of the secondary side, a source terminal operatively connected to a source terminal of the drive field effect transistor, and a gate;

a Zener diode having an anode terminal operatively connected to the gate terminal of the field effect transistor and a cathode terminal connected to the gate of said control field effect transistor.

* * * * *

UNITED STATES PATENT AND TRADEMARK OFFICE
CERTIFICATE OF CORRECTION

PATENT NO. : 4,967,101
DATED : OCTOBER 30, 1990
INVENTOR(S) : SHIGEO NAKAMURA ET AL.

It is certified that error appears in the above-identified patent and that said Letters Patent is hereby corrected as shown below:

Col. 2, line 68, "circuit The" should be --circuit.  The--.

Col. 3, line  2, "circuit The" should be --circuit.  The--;
       line 46, "$I_e$Accordingly," should be --$I_e$.  Accordingly,--;

Col. 4, line 59, "thereof but" should be --thereof, but--.

Col. 5, line 50, "coil, in for" should be --coil, for--.

Signed and Sealed this

Fifth Day of May, 1992

*Attest:*

DOUGLAS B. COMER

*Attesting Officer*   Acting Commissioner of Patents and Trademarks